(12) United States Patent
Doi

(10) Patent No.: US 6,539,157 B2
(45) Date of Patent: Mar. 25, 2003

(54) LAYERED CIRCUIT BOARDS AND METHODS OF PRODUCTION THEREOF

(75) Inventor: Yutaka Doi, Minnetonka, MN (US)

(73) Assignee: Honeywell Advanced Circuits, Inc., Minnetonka, MN (US)

( * ) Notice: Subject to any disclaimer, the term of this patent is extended or adjusted under 35 U.S.C. 154(b) by 0 days.

(21) Appl. No.: 09/752,661

(22) Filed: Dec. 28, 2000

(65) Prior Publication Data

US 2002/0085823 A1 Jul. 4, 2002

(51) Int. Cl.[7] .............................................. G02B 6/10
(52) U.S. Cl. ......................... 385/129; 385/125; 385/15
(58) Field of Search ........................ 385/125, 129–133, 385/88–94, 14, 49, 15; 65/393

(56) References Cited

U.S. PATENT DOCUMENTS

| | | | | |
|---|---|---|---|---|
| 3,663,194 A | * | 5/1972 | Greenstein et al. ........... 216/24 |
| 4,068,920 A | * | 1/1978 | Bass et al. .................... 385/125 |
| 5,363,464 A | * | 11/1994 | Way et al. .................... 333/212 |
| 5,446,814 A | * | 8/1995 | Kuo et al. ...................... 385/31 |
| 5,525,190 A | * | 6/1996 | Wojnarowski et al. ......... 216/23 |
| 5,864,642 A | * | 1/1999 | Chun et al. .................... 385/14 |
| 5,982,970 A | * | 11/1999 | Schneider ..................... 385/125 |
| 6,243,509 B1 | * | 6/2001 | Chen .......................... 385/129 |
| 6,257,771 B1 | * | 7/2001 | Okayasu ....................... 385/59 |
| 6,393,169 B1 | * | 5/2002 | Paniccia et al. ............... 385/14 |

* cited by examiner

Primary Examiner—Hemang Sanghavi
Assistant Examiner—Scott A Knauss
(74) Attorney, Agent, or Firm—Rutan & Tucker, LLP; David J. Zoetewey; Robert D. Fish

(57) ABSTRACT

Compositions and methods are provided whereby printed wiring boards may be produced that comprise a) a substrate layer, and b) a hollow, mirror-clad optical wave-guide laminated onto the substrate layer. The printed wiring board further comprises a cover material coupled to the wave-guide.

19 Claims, 2 Drawing Sheets

| Properties\Materials | Absorption Coefficient @650 nm | Refractive index | Tg (°C) | CTE (ppm) | Tensile strength (Mpa) | Modulus of elasticity (Gpa) | Cost 1 mm thick ($/ft²) |
|---|---|---|---|---|---|---|---|
| PMMA | 0.000 54 /cm | 1.49 | 115 | 90 | 41~76 | 3.5 | 1.58 |
| Polycarbonate | Same as PMMA | 1.58 | 145 | 39 | 77 | 2.2 | |
| Polystyrene | Same as PMMA | 1.58 | 100 | 40 | 52 | 3.1 | |
| Silica Glass | 0.000 01 /cm | 1.47 | 1175 | 0.55 | 75 | 70 | |
| UFFG (Ultra Fine Flat Glass) | Same as PMMA | 1.52 | 550 | 9 | 496 | 71 | 0.9 |
| BT Resin | | | 300 | 58 | 255 | 0.4~0.6 | |

FIG. 3

LAYERED CIRCUIT BOARDS AND METHODS OF PRODUCTION THEREOF

FIELD OF THE INVENTION

The field of the invention is electronic components.

BACKGROUND OF THE INVENTION

Electronic components are used in ever increasing numbers of consumer and commercial electronic products. Examples of some of these consumer and commercial products are televisions, computers, cell phones, pagers, a palm-type organizer, portable radios, car stereos, or remote controls. As the demand for these consumer and commercial electronics increases, there is also a demand for those same products to become smaller and more portable for the consumers and businesses.

As a result of the size decrease in these products, the components that comprise the products must also become smaller. Examples of some of those components that need to be reduced in size or scaled down are printed circuit or wiring boards, resistors, wiring, keyboards, touch pads, and chip packaging.

Conventional materials that are being used in printed wiring boards, such as metals, metal alloys, composite materials and polymers, can produce undesirable effects, including impedance and/or heat in the circuit board or component, because components made with those compounds are designed to carry electrons. As the components are designed and built smaller, impedance and heat can play larger roles in the component.

Thus, there is a continuing need to a) design and produce layered materials that meet customer specifications while minimizing impedance and heat, and b) incorporate optical components that transmit photons and not electrons, such as wave-guides, into and onto those layered materials while working within customer requirements and specifications, and c) incorporate layered materials that comprise optical wave-guide layers into electronic components and finished products.

SUMMARY OF THE INVENTION

Printed wiring boards may be produced that comprise a) a substrate layer, and b) a hollow, mirror clad optical wave-guide laminated onto the substrate layer. The printed wiring board further comprises a cover material coupled to the wave-guide, and at least one additional layer coupled to the cover material.

Various objects, features, aspects and advantages of the present invention will become more apparent from the following detailed description of preferred embodiments of the invention, along with the accompanying drawings in which like numerals represent like components.

BRIEF DESCRIPTION OF THE DRAWINGS

FIG. 3 is a compilation of some preferred materials and physical characteristics.

DETAILED DESCRIPTION

Electronic components, as contemplated herein, are generally thought to comprise any layered component that can be utilized in an electronic-based product. Contemplated electronic components comprise circuit boards, chip packaging, separator sheets, dielectric components of circuit boards, printed-wiring boards, and other components of circuit boards, such as capacitors, inductors, and resistors.

Electronic-based products can be "finished" in the sense that they are ready to be used in industry or by other consumers. Examples of finished consumer products are a television, a computer, a cell phone, a pager, a palm-type organizer, a portable radio, a car stereo, and a remote control. Also contemplated are "intermediate" products such as circuit boards, chip packaging, and keyboards that are potentially utilized in finished products.

Electronic products may also comprise a prototype component, at any stage of development from conceptual model to final scale-up mock-up. A prototype may or may not contain all of the actual components intended in a finished product, and a prototype may have some components that are constructed out of composite material in order to negate their initial effects on other components while being initially tested.

Figure 1:
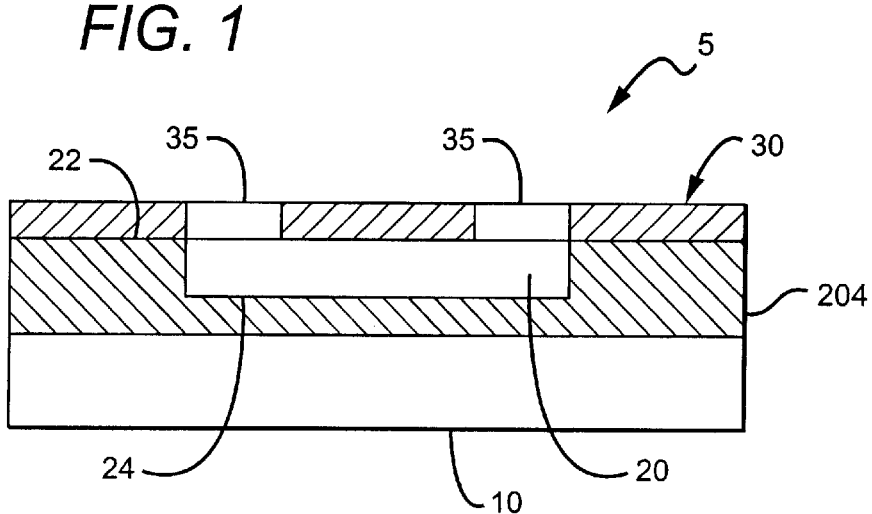
FIG. 1 is a schematic diagram of a preferred embodiment.

In FIG. 1, a printed wiring board 5 comprises a) a substrate layer 10, and b) a hollow, mirror-clad optical wave-guide 20 having a top side 22 and a bottom side 24 laminated onto the substrate layer 10. The printed wiring board further comprises a cover material 30 coupled to the wave-guide 20. The cover material 30 is further coated with a metal or other mirror-type of compound on the portion that is directly coupled to the top side 22 of the optical wave-guide 20.

Substrates and substrate layers 10, used herein interchangeably, contemplated herein may comprise any desirable substantially solid material. Particularly desirable substrate layers 10 would comprise films, glass, ceramic, plastic, metal or coated metal, or composite material. In preferred embodiments, the substrate 10 comprises a silicon or germanium arsenide die or wafer surface, a packaging surface such as found in a copper, silver, nickel or gold plated leadframe, a copper surface such as found in a circuit board or package interconnect trace, a via-wall or stiffener interface ("copper" includes considerations of bare copper and it's oxides), a polymer-based packaging or board interface such as found in a polyimide-based flex package, lead or other metal alloy solder ball surface, glass and polymers such as polyimides, BT, and FR4. In more preferred embodiments, the substrate 10 comprises a material common in the packaging and circuit board industries such as silicon, copper, glass, and another polymer.

Substrate layers 10 contemplated herein may also comprise at least two layers of materials. One layer of material comprising the substrate layer 10 may include the substrate materials previously described. Other layers of material comprising the substrate layer 10 may include layers of polymers, monomers, organic compounds, inorganic compounds, organometallic compounds, continuous layers and nanoporous layers.

As used herein, the term "monomer" refers to any chemical compound that is capable of forming a covalent bond with itself or a chemically different compound in a repetitive manner. The repetitive bond formation between monomers may lead to a linear, branched, super-branched, or three-dimensional product. Furthermore, monomers may themselves comprise repetitive building blocks, and when polymerized the polymers formed from such monomers are then termed "blockpolymers". Monomers may belong to various chemical classes of molecules including organic, organometallic or inorganic molecules. The molecular weight of monomers may vary greatly between about 40 Dalton and 20000 Dalton. However, especially when monomers comprise repetitive building blocks, monomers may have even higher molecular weights. Monomers may also include additional groups, such as groups used for crosslinking.

As used herein, the term "crosslinking" refers to a process in which at least two molecules, or two portions of a long molecule, are joined together by a chemical interaction. Such interactions may occur in many different ways including formation of a covalent bond, formation of hydrogen bonds, hydrophobic, hydrophilic, ionic or electrostatic interaction. Furthermore, molecular interaction may also be characterized by an at least temporary physical connection between a molecule and itself or between two or more molecules.

Contemplated polymers may also comprise a wide range of functional or structural moieties, including aromatic systems, and halogenated groups. Furthermore, appropriate polymers may have many configurations, including a homopolymer, and a heteropolymer. Moreover, alternative polymers may have various forms, such as linear, branched, superbranched, or three-dimensional. The molecular weight of contemplated polymers spans a wide range, typically between 400 Dalton and 400000 Dalton or more.

Examples of contemplated inorganic compounds are silicates, aluminates and compounds containing transition metals. Examples of organic compounds include polyarylene ether, polyimides and polyesters. Examples of contemplated organometallic compounds include poly (dimethylsiloxane), poly(vinylsiloxane) and poly (trifluoropropylsiloxane).

The substrate layer 10 may also comprise a plurality of voids if it is desirable for the material to be nanoporous instead of continuous. Voids are typically spherical, but may alternatively or additionally have any suitable shape, including tubular, lamellar, discoidal, or other shapes. It is also contemplated that voids may have any appropriate diameter. It is further contemplated that at least some of the voids may connect with adjacent voids to create a structure with a significant amount of connected or "open" porosity. The voids preferably have a mean diameter of less than 1 micrometer, and more preferably have a mean diameter of less than 100 nanometers, and still more preferably have a mean diameter of less than 10 nanometers. It is further contemplated that the voids may be uniformly or randomly dispersed within the substrate layer. In a preferred embodiment, the voids are uniformly dispersed within the substrate layer 10.

Thus, it is contemplated that the substrate layer 10 may comprise a single layer of conventional substrate material. It is alternatively contemplated that the substrate layer 10 may comprise several layers, along with the conventional substrate material, that function to build up part of the layered circuit board 5.

Suitable materials that can be used in additional substrate layers 10 comprise any material with properties appropriate for a printed circuit board or other electronic component, including pure metals, alloys, metal/metal composites, metal ceramic composites, metal polymer composites, cladding material, laminates, conductive polymers and monomers, as well as other metal composites.

As used herein, the term "metal" means those elements that are in the d-block and f-block of the Periodic Chart of the Elements, along with those elements that have metal-like properties, such as silicon and germanium. As used herein, the phrase "d-block" means those elements that have electrons filling the 3d, 4d, 5d, and 6d orbitals surrounding the nucleus of the element. As used herein, the phrase "f-block" means those elements that have electrons filling the 4f and 5f orbitals surrounding the nucleus of the element, including the lanthanides and the actinides. Preferred metals include titanium, silicon, cobalt, copper, nickel, zinc, vanadium, aluminum, chromium, platinum, gold, silver, tungsten, molybdenum, cerium, promethium, and thorium. More preferred metals include titanium, silicon, copper, nickel, platinum, gold, silver and tungsten. Most preferred metals include titanium, silicon, copper and nickel The term "metal" also includes alloys, metal/metal composites, metal ceramic composites, metal polymer composites, as well as other metal composites.

A hollow, mirror-clad optical wave-guide 20 can then be laminated onto the substrate layer 10. The optical wave-guide 20 is similar in optical theory to a fiber optic cable or wire, in that they are both used to transmit light, or photons, as opposed to conventional cable that transmits electrons. The use of an optical wave-guide 20 is preferred over conventional electrical cable because of the minimization or elimination altogether of impedance, at least with respect to that particular component and surrounding components in a circuit board 5.

The optical wave-guide 20 can be produced from several different classes of compounds and materials. The wave-guides 20 may comprise polymers monomers, organic compounds, inorganic compounds, and ultimately any suitable compound that can function as an optical material. It is preferred that the optical wave-guides 20 comprise polymers, acrylic monomers, inorganic compounds and resins. Optical wave-guides 20 contemplated herein may also be doped wit other materials, such as phenanthrenequinone. In preferred embodiments, the wave-guides 20 comprise polycarbonate, polystyrene, silica glass, PMMA, cycloolefincopolymers, ultra fine flat glass or BT (triazine/bismalemide) resin, as shown in FIG. 3.

Figure 2A:
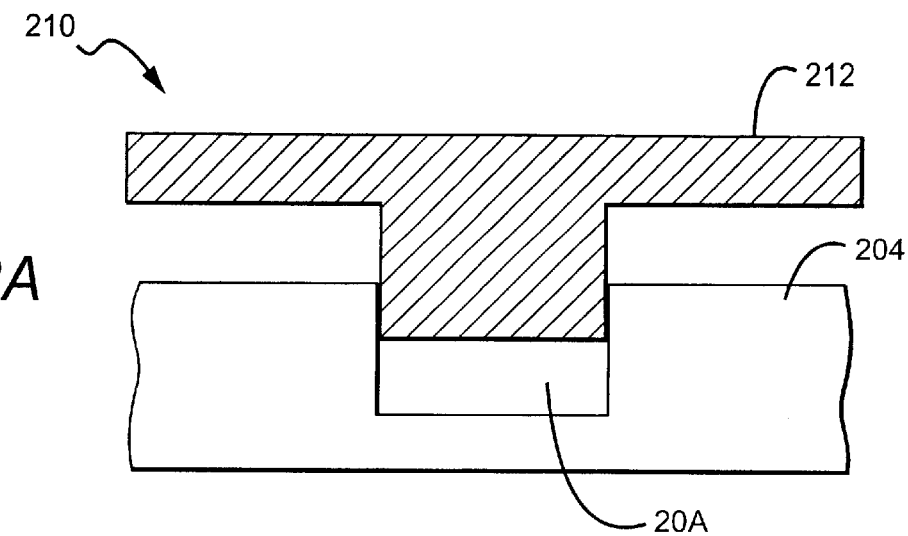
FIG. 2 shows several methods of production of preferred embodiments.
Figure 2B:
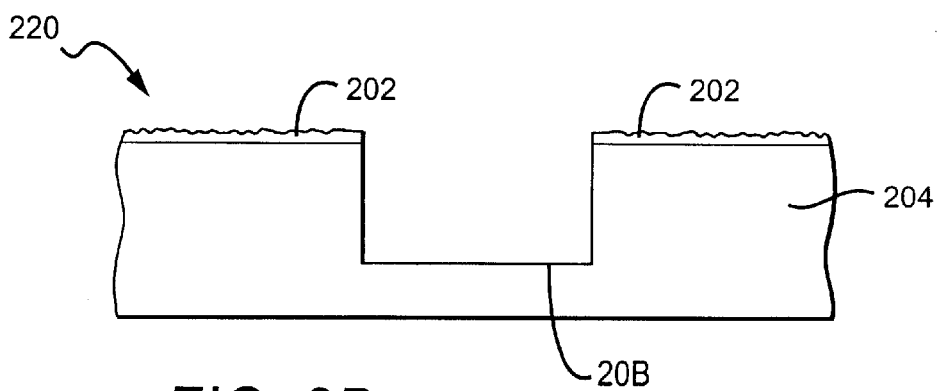

As mentioned earlier, hollow optical wave-guides can be produced by several different methods, including a) molding 210, b) etching 220 or c) a combination of the previous two methods. These methods are descriptively shown in FIG. 2.

Molding 210 the optical wave-guide 20 is a process where the optical material 204 is heated and a pre-cut mold 212 is forced into the optical material 204 to form the wave-guide 20. Any suitable materials may be used to form the mold 212, as long as the materials used do not interfere with the chemical integrity of the wave-guide material 204. For example, if the mold 212 is made from a composite material that may fracture or break apart at certain temperatures, the vendor may not want to use this mold material for some optical wave-guide 20 applications for fear that the composite material of the mold 212 may break off into the wave-guide material 204 or put a superficial coating on the final wave-guide material 204 that will impair its performance in the electronic application.

Etching 220 the optical wave-guide 20 is a procedure that etches away materials from a "block" of optical wave-guide materials 204 until a desired optical wave-guide 20 is produced. The etching process 220 can be chemically based, mechanically based, or a combination of both depending on the needs of the customer and the machinery available for the vendor. It is desirable, however, that the etching process 220 leave a surface that is acceptable for the components specifications—such as either being roughened or smoothed depending on the specifications. It is further desirable that the etching processes 220 not chemically interfere with the optical wave-guide materials 204 unless that interference is intended and desired.

In addition, as mentioned earlier, the optical wave-guide 20 is mirror-clad with a suitable reflective material and/or metal according to the needs of the customer and component. The reflective component can be doped with another chemical compound in order to meet the specifications or requirements of the customer or the component. In some embodiments, the ends of the wave-guide 20 will be etched at a 45° angle and those ends will then be coated with a mirroring material or reflective material. In other embodiments, the hollow optical wave-guide 20 can be advantageously coated with a reflective material or mirror compounds in specific locations on the wave-guide 20 in order to direct light in a certain direction.

Further, it is preferred that the hollow optical wave-guides 20 contemplated herein comprise a hollow material that is relatively and substantially planar. As used herein, the term "planar" means that the wave-guide 20 is designed to be spatially within a plane—or what might be considered an "x-y" coordinate system. Obviously, the optical wave-guide 20 will have depth to it, or a "z" component in a coordinate system, but the wave-guide 20 will still be substantially planar. There may also be sections of the wave-guide 20 that are bumpy or rough—but again, it is desirable that the wave-guide 20 be substantially planar. Nevertheless, ultimately, the dimensions and physical properties of the optical wave-guides 20 will be determined by the customer, the electronic component and the product.

A layer of cover material 30 that is preferably transparent or translucent is coupled to the optical wave-guide 20. The cover material 30 are preferably the same materials from which the hollow optical wave-guide 20 is made. It is contemplated, however, that the cover material 30 is different in chemical composition to the hollow optical wave-guide 20. The layer of cover material 30 can be any appropriate thickness, depending on the needs of the customer or the component.

The layer of cover material 30 is also contemplated to be coated with a suitable reflective material or mirror on the side that will directly couple with the top side 22 of the optical wave-guide 20. This reflective material on the cover material layer optically "closes in" the hollow wave-guide, and thus allowing photons to exit through predetermined and predesigned holes 35 in the optical wave-guide. The cover material 30 can be completely coated with reflective material, or some of the reflective material may be etched away or otherwise removed for the specifications and requirements of the component.

Additional layers of material may be coupled to the cover material 30 in order to continue building a layered component or printed circuit board 5. It is contemplated that the additional layers will comprise materials similar to those already described herein, including metals, metal alloys, composite materials, polymers, monomers, organic compounds, inorganic compounds, organometallic compounds, resins, adhesives and optical wave-guide materials.

Thus, specific embodiments and applications of electronic components comprising hollow, mirror-clad optical wave-guides have been disclosed. It should be apparent, however, to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

What is claimed is:

1. A printed circuit board, comprising a substrate layer;

an optical wave-guide layer including an optical wave-guide cavity, the wave-guide layer coupled to the substrate layer; and a cover layer coupled to the wave-guide layer and at least partially covering the optical wave-guide cavity, the cover layer comprising at least two holes adapted to allow photons to pass through the cover layer, the at least two holes being adjacent to the wave-guide cavity; wherein the optical wave-guide cavity comprises a top side formed by the cover layer, and a bottom side that is part of the optical wave-guide layer, wherein the top and bottom sides are coated with a reflective coating.

2. The printed circuit board of claim 1 wherein the optical wave-guide cavity comprises two ends, each end being mirror coated and etched at a forty-five degree angle, and the at least two holes are adjacent the ends of the optical wave-guide cavity.

3. The printed circuit board of claim 1 wherein the cover layer comprises a transparent or translucent material coated with the reflective coating, the at least two holes passing through the reflective coating but not the transparent or translucent material.

4. The printed circuit board of claim 1, wherein the substrate is a wafer.

5. The printed circuit board of claim 1, wherein the substrate comprises at least two layers of materials.

6. The printed circuit board of claim 5, wherein the at least two layers of materials comprise one or more of silica wafers, dielectric materials, adhesive materials, resins, metals, metal alloys, and composite materials.

7. The printed circuit board of claim 1, wherein the wave-guide layer comprises a silicon-based material.

8. An electronic component comprising the printed circuit board of claim 1.

9. A printed circuit board, comprising substrate layer;

an optical wave-guide layer including an optical wave-guide cavity, the wave-guide layer coupled to the substrate layer;

a cover layer coupled to the wave-guide layer and partially covering the optical wave-guide cavity, the cover layer comprising at least two holes adapted to allow photons to pass through the cover layer, the at least two holes being adjacent to the wave-guide cavity; wherein the optical wave-guide cavity comprises two ends, each end being mirror coated and etched at a forty-five degree angle; and the optical wave-guide cavity comprises a top side formed by the cover layer, and a bottom side that is part of the optical wave-guide layer, wherein the top and bottom sides are coated with a reflective coating.

10. The printed circuit board of claim 9, further comprising at least one additional layer coupled to the cover layer.

11. The printed circuit board of claim 10, wherein the at least one additional layer comprises at least one of a metal, a metal alloy, a composite material, a polymer, a monomer, an organic compound, an inorganic compound and an organometallic compound.

12. The printed circuit board of claim 9, wherein the cover layer comprises the same material as the optical wave-guide layer.

13. A method of producing printed circuit board comprising:

providing a substrate;

producing an optical wave-guide layer comprising an open top mirror-clad optical wave-guide cavity;

providing a cover layer that is mirror-clad on at least a portion of one side and comprises at least two holes passing through the cover layer;

coupling the wave-guide layer to the substrate; and coupling the cover layer to the optical wave-guide layer such that the mirror-clad portion of the cover layer partially covers the wave-guide cavity, and the holes of the cover layer prove openings into the optical wave-guide cavity.

14. The method of claim 13 wherein producing an optical wave-guide layer comprises forming an optical wave-guide cavity in the optical wave-guide layer, the optical wave-guide cavity comprising, mirror coated ends angled at forty-five degrees.

15. The method of claim 14 wherein producing an optical wave-guide layer comprises molding the wave-guide cavity into the optical wave-guide layer and subsequently coating the sides of the cavity with a reflective coating.

16. The method of claim 14 wherein producing an optical wave-guide layer comprises etching the wave-guide cavity into the optical wave-guide layer and subsequently coating the sides of the cavity with a reflective coating.

17. The method of claim 14, the substrate comprises at least two layers of materials.

18. The method of claim 17, wherein the at least two layers of materials comprise one or more of silica wafers, dielectric materials, adhesive materials, resins, metals, metal alloys, and composite materials.

19. The method of claim 14, wherein the optical wave-guide layer is a silicon-based material.

* * * * *